United States Patent
Yan et al.

(10) Patent No.: US 7,438,822 B2
(45) Date of Patent: Oct. 21, 2008

(54) APPARATUS AND METHOD FOR SHIELDING A WAFER FROM CHARGED PARTICLES DURING PLASMA ETCHING

(75) Inventors: Hongwen Yan, Somers, NY (US); Brian L. Ji, Fishkill, NY (US); Siddhartha Panda, Beacon, NY (US); Richard Wise, New Windsor, NY (US); Bomy A. Chen, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 11/260,375

(22) Filed: Oct. 28, 2005

(65) Prior Publication Data

US 2006/0037940 A1   Feb. 23, 2006

Related U.S. Application Data

(62) Division of application No. 10/314,497, filed on Dec. 6, 2002, now abandoned.

(51) Int. Cl.
*C23F 1/00* (2006.01)
(52) U.S. Cl. .............................. 216/37; 216/55; 216/62
(58) Field of Classification Search ........................ None
See application file for complete search history.

(56) References Cited

U.S. PATENT DOCUMENTS

| | | | |
|---|---|---|---|
| 4,422,896 A | 12/1983 | Class et al. | |
| 4,609,428 A | 9/1986 | Fujimura | |
| 4,668,338 A | 5/1987 | Maydan et al. | |
| 5,225,024 A | 7/1993 | Hanley et al. | |
| 5,556,501 A | 9/1996 | Collins et al. | |
| 5,707,486 A | 1/1998 | Collins | |
| 5,888,414 A | 3/1999 | Collins et al. | |
| 6,014,979 A * | 1/2000 | Van Autryve et al. | 134/1.1 |
| 6,068,784 A | 5/2000 | Collins et al. | |
| 6,113,731 A | 9/2000 | Shan et al. | |
| 6,143,140 A | 11/2000 | Wang et al. | |
| 6,164,240 A | 12/2000 | Nikulin | |
| 6,251,792 B1 | 6/2001 | Collins et al. | |
| 2002/0004309 A1 | 1/2002 | Collins et al. | |

FOREIGN PATENT DOCUMENTS

| | | |
|---|---|---|
| EP | 0328078 A | 8/1989 |
| EP | 0831516 | 3/1998 |

\* cited by examiner

*Primary Examiner*—Allan Olsen
(74) *Attorney, Agent, or Firm*—Whitham, Curtis, Christofferson & Cook, PC; Yuanmin Cai

(57) ABSTRACT

A plasma etching system having a wafer chuck with a magnet that applies a magnetic field over a wafer to shield the wafer from charged particles. The magnetic field is parallel with the wafer, and is strongest near the wafer surface. The magnetic field may be straight, or circular. In operation, electrons are deflected from the wafer by the Lorentz force, the wafer acquires a positive charge, and ions are deflected by electrostatic repulsion. Neutral species are allowed through the magnetic field, and they collide with the wafer. Neutral species generally provide more isotropic and material-selective etching than charged particles, so the present magnetic field tends to increase etch isotropy and material selectivity. Also, the magnetic field can protect the wafer from seasoning processes designed to clean unwanted films from the chamber surface as seasoning processes typically rely on etching by charged particles.

8 Claims, 3 Drawing Sheets

APPARATUS AND METHOD FOR SHIELDING A WAFER FROM CHARGED PARTICLES DURING PLASMA ETCHING

RELATED APPLICATION

This application is a divisional of U.S. Ser. No. 10/314,497 filed on Dec. 6, 2002 now abandoned and is incorporated herein by reference.

BACKGROUND OF THE INVENTION

1. Field of the Invention

The present invention relates generally to plasma etching of thin film structures such as microelectronics. More particularly, it relates to a method for shielding substrates from charged particles during plasma etching to provide protection during certain process conditions, or to modulate etching anisotropy.

2. Background of the Invention

Plasma etching is commonly employed in manufacturing microelectronics and micromechanical devices. Plasma etching is used to remove thin films, pattern thin films, or for forming micromachined features. In plasma etching, radiofrequency power is applied to a gas mixture, generating charged particles which aid the etching process. Uncharged reactive particles are also very important to the plasma etching process in that they provide most of the material removal.

In most applications of plasma etching, it is important to control the plasma characteristics so that the plasma has selectivity for certain materials. Also, it can be important in many cases to control the plasma so that it removes material anisotropically or isotropically, as this will greatly effect the shape of etched features. This can be extremely important in manufacturing microelectronics where the shape of an etched sidewall can determine the electrical properties of a device. Also, plasma etch anisotropy/isotropy can be a critical factor in manufacturing micromechanical devices since the etching anisotropy can determine the shape of a final device. It would be a considerable advance in the art of plasma etching to provide a method for tuning the anisotropy/isotropy of a plasma etch process. It would also be an advance to be able to switch between high anisotropy and high isotropy in the same etching system and using the same etching gas mixture. Such capabilities would allow for fabrication of novel structures, and could increase throughput in microelectronics manufacturing.

Another concern with plasma etching is the buildup of thin films on the plasma etch chamber walls. Thin films are often deposited on the walls of a chamber during plasma etching, or during deposition processes. Plasma enhanced chemical vapor deposition (PECVD) of silicon dioxide, for example, typically forms oxide deposits on chamber surfaces far from the target wafer. Also, polymers can be deposited on the chamber walls during plasma etching. Such unwanted thin films on the chamber surfaces can change the electromagnetic properties (e.g. impedance) of the chamber, and thereby alter the amount of radiofrequency energy coupled to the plasma. This results in inconsistent plasma etching characteristics that can reduce manufacturing yield.

In order to prevent changes in chamber characteristics and maintain consistent plasma etching characteristics, the chamber is periodically cleaned of deposited thin films (a process called 'seasoning'). In seasoning, a special seasoning gas mixture is flowed into the chamber. The seasoning gas mix is formulated to remove films from the chamber walls and restore the chamber to its original condition. Wafers are typically removed during seasoning because the seasoning gas mixture can damage the thin films on the wafer. For example, the unwanted films on the chamber can be the same as the films on the wafer, and exposing the wafer to seasoning will remove the thin films from the wafer as well.

However removing the wafer during seasoning takes time and therefore tends to reduce system throughput. Also, seasoning with the wafer removed can damage the electrostatic chuck since the seasoning plasma can attack the chuck. It would be an advance in the art of plasma processing and chamber seasoning to provide a method for seasoning a chamber with the wafer in-situ while avoiding damage to the wafer. Such an advance would increase manufacturing throughput, and allow for increased control in plasma processing.

Accordingly, the present invention provides an apparatus for tuning or altering the isotropy/anisotropy of plasma etch processes and for allowing in-situ chamber seasoning. Consequently, the present invention provides many advantages such as improved plasma system performance, higher throughput, and higher yield.

SUMMARY OF THE INVENTION

The present invention includes an apparatus for plasma etching having a wafer chuck and a volume for plasma above the wafer chuck. A magnet is positioned in the wafer chuck for producing a magnetic field parallel to a wafer on the wafer chuck. The magnetic field is strongest near the wafer, and decreases in strength with distance above the wafer, such that electrons from the plasma traveling toward the wafer are reflected away from the wafer by the magnetic field.

The magnetic field can be round (e.g. circular) as viewed from above the wafer chuck. In this case, the magnetic field can be oriented in the clockwise (preferred) or counterclockwise direction. The magnet can be an electromagnet or permanent magnet. The magnetic field can also be linear.

In one embodiment, the magnetic field decreases in strength by at least about 75% from the wafer to the volume for plasma. This is to assure that the plasma is not overly confined or impacted by the magnetic field, which is undesirable in the invention. The magnetic field can be designed so that the magnetic field reflects electrons having an energy of 20 eV or less traveling toward the wafer in a Z-direction. In a typical plasma used for etching, most electrons will have an energy less than 20 eV.

The present invention includes a method for shielding a wafer from charged particles produced in a plasma. The present method includes producing a plasma above the wafer, and creating a magnetic field between the wafer and the plasma. The magnetic field is parallel with the wafer and decreases in strength with distance above the wafer such that electrons from the plasma traveling toward the wafer are reflected away from the wafer by the magnetic field.

The plasma chemistry may be selected such that shielding the wafer from the charged particles causes an increase in the isotropy of an etching process. The magnetic field may be designed so that it reflects electrons having an energy of 20 eV or less traveling toward the wafer.

The chemistry of the plasma may also be selected so that the plasma provides chamber seasoning. In this case, the magnetic field protects the wafer from damage during the seasoning process. The magnetic field may be designed to reflect electrons from the plasma having an energy of 100 eV or less.

The present invention also includes a method for chamber seasoning including producing a chamber seasoning plasma above a wafer, and creating a magnetic field between the wafer and seasoning plasma. The magnetic field is parallel to the wafer and the magnetic field decreases in strength with distance above the wafer. The magnetic field reflects electrons having an energy of 100 eV or less traveling toward the wafer.

DETAILED DESCRIPTION

The present invention provides a plasma etching system that can shield a wafer from charged particles. The plasma etching system has a wafer chuck with a magnet inside the chuck. The magnet produces a magnetic field parallel with the wafer surface. The magnetic field reflects plasma electrons traveling towards the wafer. Changing the strength of the magnetic field provides control over the number of charged particles incident on the wafer. The magnetic field is capable of tuning the anisotropy/isotropy of a plasma etching process, and capable of preventing damage to the wafer during chamber seasoning. In fact, the etch can be made almost wholly isotropic for certain plasma etching chemistries in combination with a high magnetic field. In seasoning, the magnetic field blocks charged particles, and this can almost completely prevent the seasoning plasma from damaging the wafer.

Figure 1:
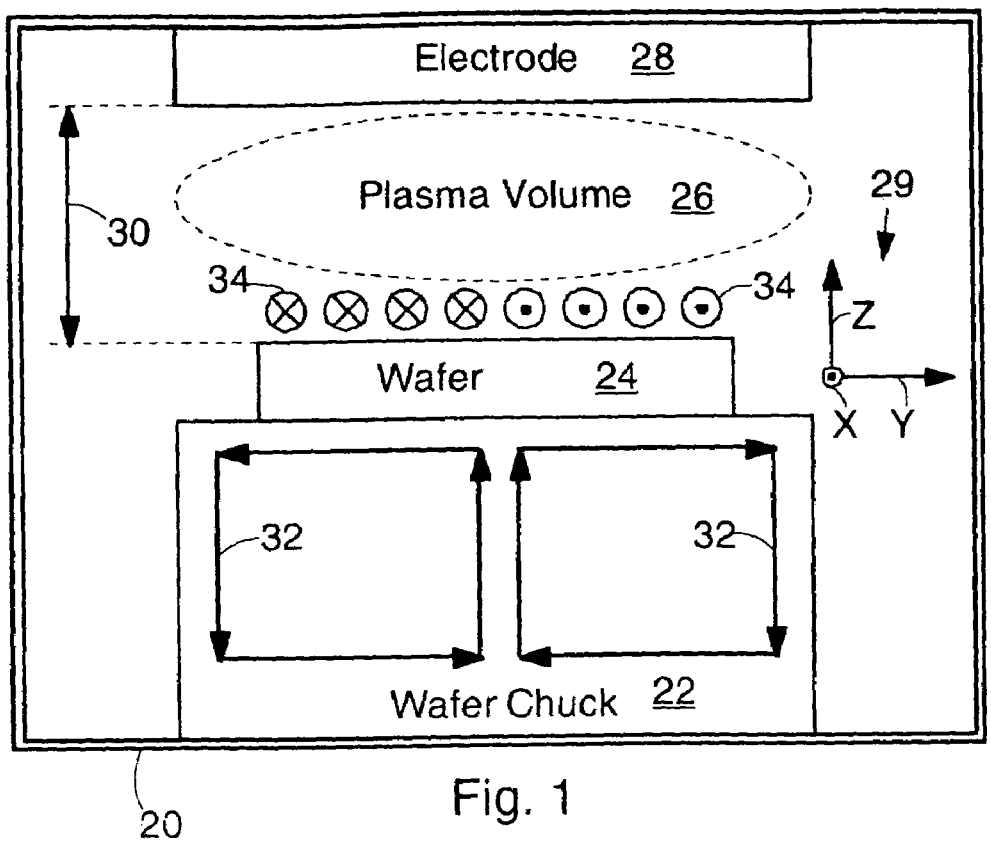
FIG. 1 is a cross sectional side view of the present invention.

FIG. 1 shows a side view of an embodiment of the present invention having a wafer chuck 22 inside the chamber 20, a wafer 24 on the chuck 22, and a plasma volume 26 where a plasma is generated. An electrode 28 may be disposed above the wafer. A gap distance 30 is a distance between the wafer and electrode 28. An electromagnet 32 with a toroidal current configuration is disposed in the wafer chuck 22. The direction of current in the electromagnet 32 is indicated by arrows. A magnetic field 34 created by the electromagnet is disposed above the wafer 24. The magnetic field is circular as viewed from above the wafer; ⊗ symbols indicate a magnetic field directed into the page and O symbols indicate a magnetic field directed out of the page. FIG. 1 includes a fiducial coordinate system 29 for explanation of the invention. The Z-direction is perpendicular to the wafer.

The chamber 20 can be a conventional vacuum chamber of the type used for plasma processors. The walls of the chamber 20 can be function as electrodes for exciting a plasma, as known in the art.

The wafer chuck can be a conventional electrostatic wafer chuck as known in the art. Other kinds of wafer chucks can also be used.

The gap distance 30 can be in the range of about 1-20 cm, as is typical for plasma etching systems.

The electromagnet 32 can be replaced with a permanent magnet, such as a ceramic or rare earth magnet. The magnet 32 can include pole pieces (not shown) to make the magnetic field more uniform. If a permanent magnet is used, it can have a ring shape so that a circular magnetic field is provided, as in the embodiment of FIG. 1. Also, if a permanent magnet is used, a variable-reluctance magnetic circuit can be provided to control the strength of the magnetic field above the wafer. In the case where an electromagnet is used, the magnetic field strength can be adjusted by varying the current.

Other elements that can be added to the apparatus (not shown) include a radiofrequency energy generator for exciting the plasma, a impedance matching network for coupling the RF generator to the plasma, vacuum pumps for evacuating the chamber, and external magnets for preventing contact of the plasma with chamber walls.

The magnetic field 34 is strongest at the wafer surface and decreases rapidly in strength in the Z-direction. The magnetic field can decrease by about 75% at a distance of about ¼ the gap distance 30 above the wafer, or can decrease by about 75% between the wafer and plasma volume 26. The magnetic field is preferably uniform (e.g. uniform to within 10% in the X-Y plane at the wafer surface). The magnetic field can have a strength of about 5-50 Gauss at the wafer surface, for example. The magnetic field is preferably parallel with the wafer (e.g. parallel to within about 20 degrees); however, the magnetic field may be more angled with respect to the wafer at the edges.

Figure 2:
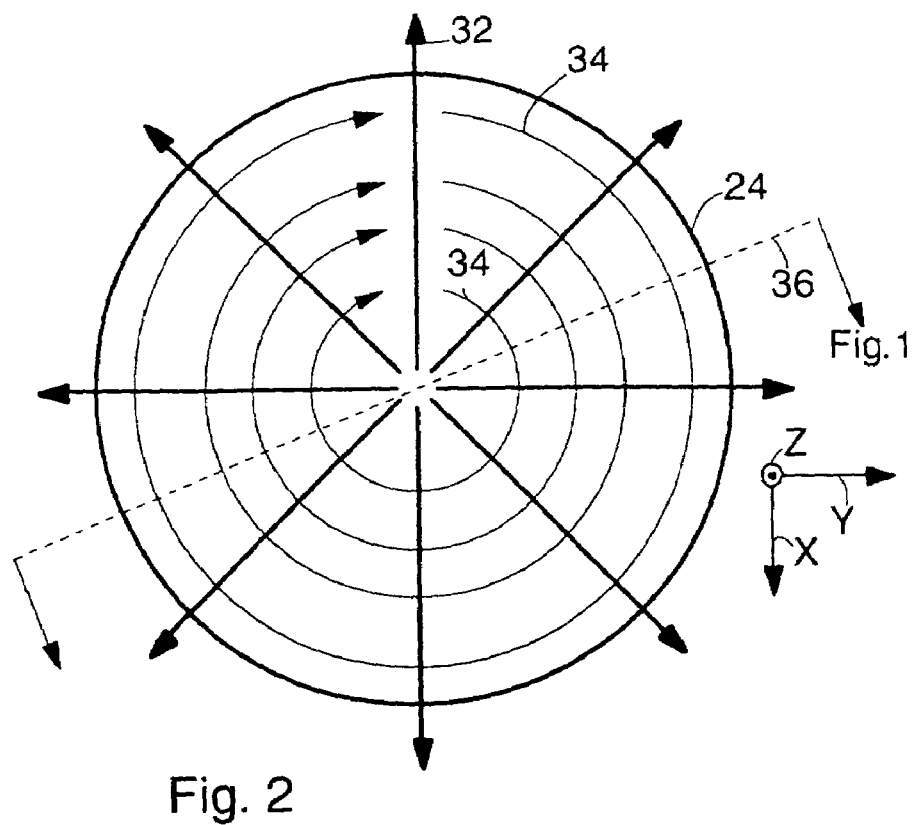
FIG. 2 is a top view of the embodiment of FIG. 1, illustrating a circular magnetic field about the wafer.

FIG. 2 shows a top view of the wafer 2. The circular magnetic field 34 can be clearly seen. Also shown are windings in the electromagnet 32 with the current direction indicated; the current at the top of the electromagnet travels out from the center. Dotted line 36 indicates the cross sectional plane of FIG. 1. It is noted that although the magnetic field is shown as circular, it most generally has a round shape, such as an oval shape as viewed from above.

Figure 3:
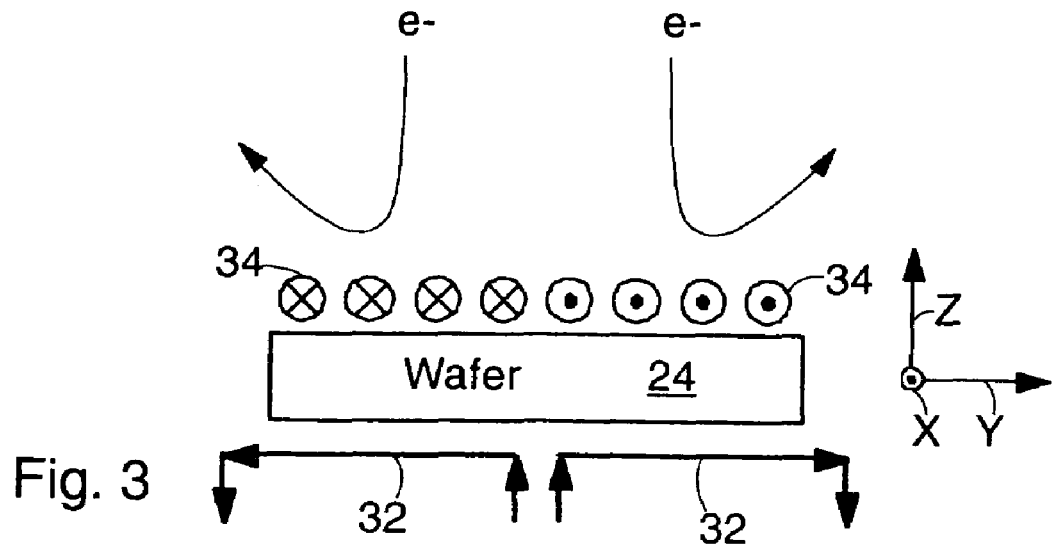
FIG. 3 is a cross-sectional view of an embodiment having a clockwise magnetic field in operation, illustrating trajectories of plasma electrons.

FIG. 3 shows a closeup of the present invention in operation. When exposed to excited plasma, the magnetic field 34 acts as a 'magnetic mirror' for plasma electrons, and to a lesser extent, for plasma ions. Electrons e− experience a Lorentz force as they approach the wafer. The Lorentz force is defined as Force=QVXB, where Q is charge of a charged particle (e.g. electron charge), V is velocity, B is magnetic field strength, and X is the vector cross-product. With the magnetic field having a clockwise direction as shown in FIGS. 2 and 3, electrons will be deflected towards the edge of the wafer as shown in FIG. 3. With sufficient magnetic field strength, all but the highest-energy electrons will be unable to reach the wafer surface. Ions (not shown), however, will more easily penetrate the magnetic field 34 since they have greater mass. As a result, the wafer 24 and chuck 22 will become positively charged (over the course of several RF cycles). The positively charged wafer will then repel ions. As a result of these effects, all charged particles (electrons and ions) are prevented from colliding with the wafer surface while the magnetic field 34 is applied.

Figure 4:
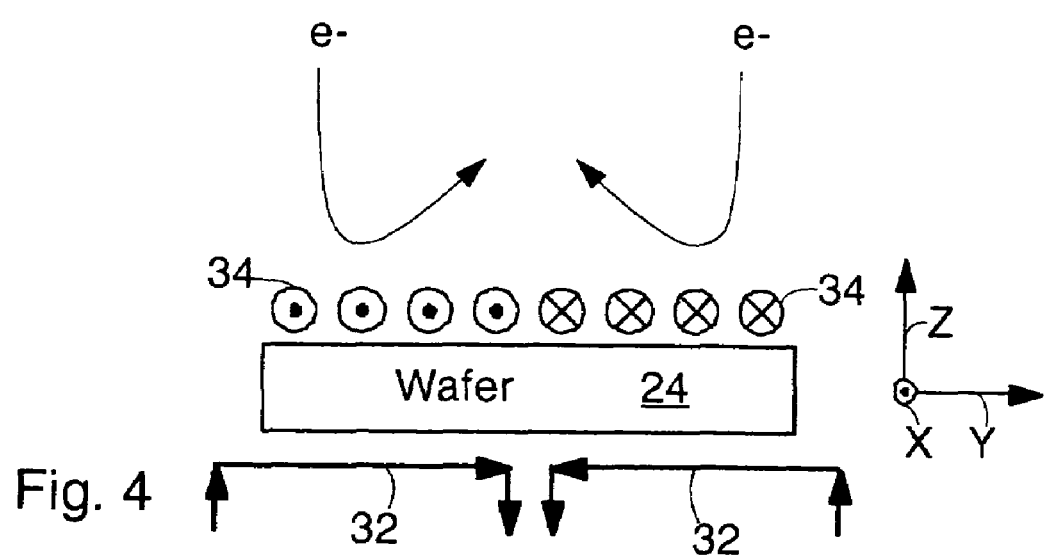
FIG. 4 is a cross-sectional view of an embodiment having a counter-clockwise magnetic field in operation, illustrating trajectories of plasma electrons.

FIG. 4 shows an alternative embodiment of the invention where the current in the electromagnet 32 is reversed compared to the embodiment of FIG. 3. In this case, the magnetic field as viewed from above is directed in the counter-clockwise direction. Electrons traveling toward the wafer 24 will be deflected by the Lorentz force toward the center of the wafer 24, and will therefore be prevented from colliding with the wafer surface. Also in this case, ions will produce a positive charge on the wafer 24 that ultimately prevents ions from colliding with the wafer 24. So, the embodiments of FIG. 3 and FIG. 4 both function to prevent charged particles from colliding with the wafer surface.

However, the embodiments of FIG. 3 and FIG. 4 have an important difference. Directing the electrons to the wafer edge, as in the embodiment of FIG. 3 will tend to produce less perturbation in the plasma (e.g. changes in plasma chemistry and etching properties). This is because the electrons are deflected away from the plasma toward the chamber walls. By comparison, directing the electrons toward the center as in FIG. 4 may tend to create greater perturbations in the plasma when the magnetic field is turned on. Perturbations in the plasma are generally best avoided since they can alter the plasma etching properties. One caveat is that the extent of plasma perturbations will depend somewhat on the shape of the chamber 20. If the chamber is very wide (i.e. large in the X and Y directions compared to the size of the wafer), then the embodiment of FIG. 4 may produce less plasma perturbations. This is because the electrons must travel to the top of the chamber 20 or electrode 28 instead of the distant chamber sidewalls. Conversely, if the chamber is narrow (as in most plasma processors) then it is best to direct the electrons toward the wafer edge, since this will direct the electrons to the sidewalls. For these reasons, it is generally preferred that the magnetic field have a clockwise direction, as viewed from above.

Figure 5A:
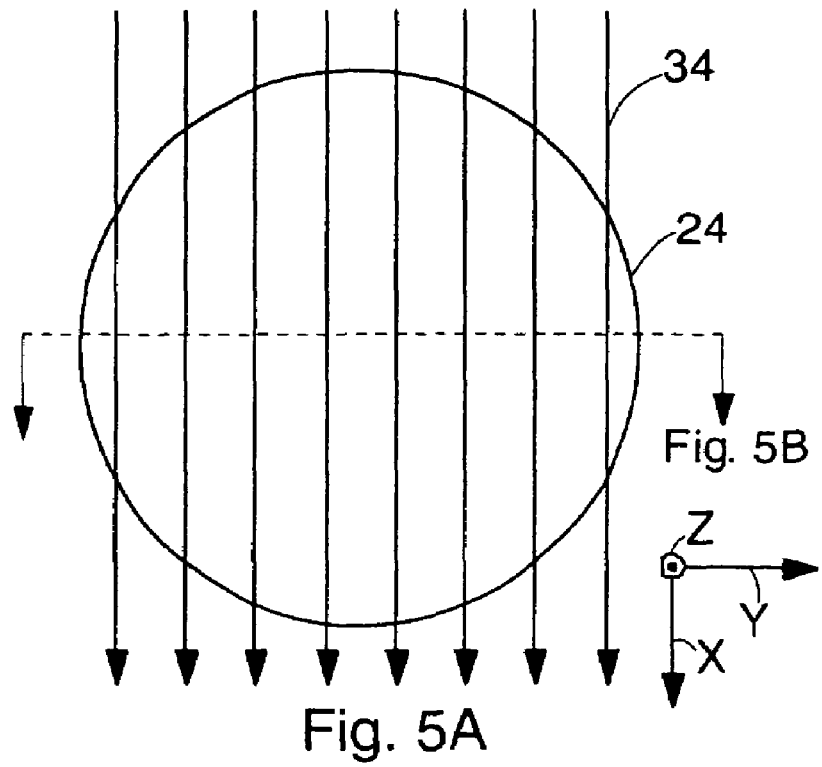
FIGS. 5A and 5B are top and cross-sectional views, respectively, of an embodiment having a linear magnetic field.
Figure 5B:
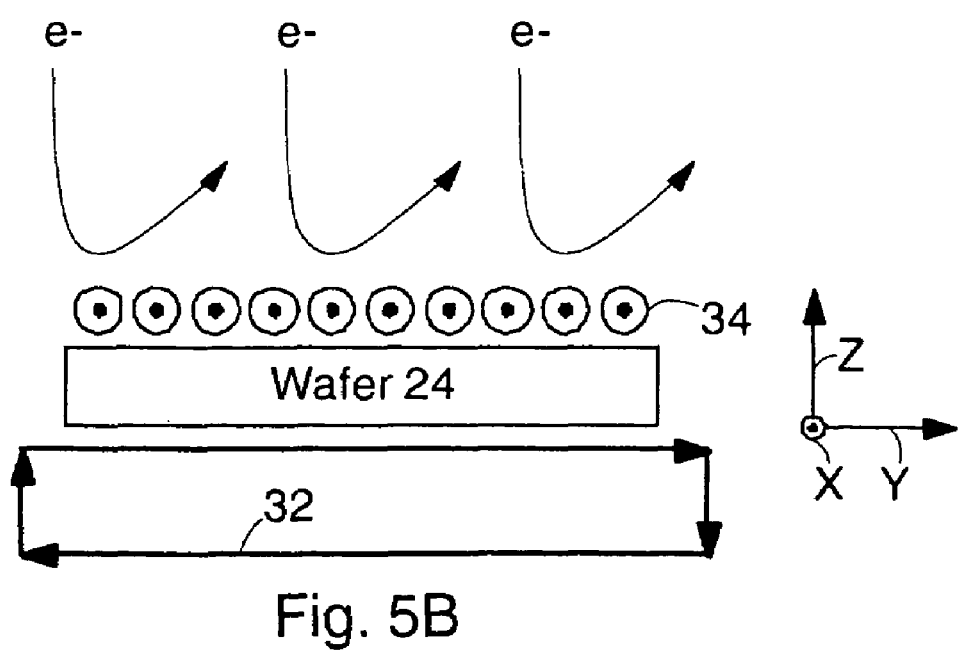

FIGS. 5A and 5B show another embodiment of the present invention where the magnetic field 34 is linear and parallel with the surface of the wafer 24. FIG. 5A is a top view of the wafer 24 and magnetic field 34. The magnetic field 34 is straight, parallel with the wafer surface, and preferably uniform to about 10% over the entire wafer surface. FIG. 5B illustrates the device of FIG. 5A in operation. Plasma electrons e– are deflected by the Lorentz force to one side of the wafer 24. The magnetic field 34 of FIGS. 5A and 5B functions as a magnetic mirror for charged particles in a manner very similar to the embodiments of FIGS. 2, 3, and 4. However, the electromagnet required for the magnetic field of FIGS. 5a and 5B may be more difficult to fabricate. So, while generally not preferred compared to the embodiments of FIGS. 2, 3 and 4, the embodiment of FIGS. 5A and 5B is functional according to the present invention and is within the scope of the present claims.

In the present invention, it is essential for the magnetic field 34 to have a gradient such that the field is strongest near the wafer 24, and declines in strength in the Z-direction. This gradient must be great enough so that most plasma electrons e– are turned away from the wafer 24 by the Lorentz force. It is noted that not all electrons need to be (or can be) deflected by the Lorentz force. The number of electrons e– that penetrate the magnetic field 24 and collide with the wafer 24 will depend on the energy distribution of the electrons in the plasma, the strength and gradient of the magnetic field, and the uniformity of the magnetic field.

Also, the magnetic field 34 and plasma volume should be separated so that the plasma is not trapped within the magnetic field 34. If the plasma is trapped within the magnetic field 34, then the charged particle flux to the wafer will be greatly increased. The magnetic field should be disposed between the wafer and plasma, so that the magnetic field acts to shield the wafer from charged particles in the plasma. The magnetic field 34 of the present invention is necessarily designed so that the charge particle flux to the wafer is decreased compared to the no-field condition.

A useful characterization of the magnetic field and electron interaction is based on the gyroradius of an electron approaching the wafer surface. An electron traveling in the magnetic field 34 will travel in a circular path due to the Lorentz force. In the present invention, the magnetic field 34 should have a thickness that is greater than the gyroradius of a plasma electron in the magnetic field. Sufficient thickness assures that most electrons will be turned away from the wafer surface. Calculation of the gyroradius of an electron in a magnetic field is well known in the art. As a specific example, however, it is noted that most electrons in a plasma used for plasma etching will have energies of less than 20 eV. If the magnetic field 34 has a strength of about 13.7 Gauss, the 20 eV electrons will have a gyroradius of about 1 cm. Therefore, a magnetic field 34 with approximately this strength and thickness can be used to provide the magnetic mirror effect. It is understood that the magnetic field 34 is very nonuniform in the Z-direction, however, and therefore the gyroradius will change dramatically as an electron approaches and departs from the wafer surface.

It is noted that neutral (gas phase) species will not be blocked by the magnetic field 34. Therefore, the flux of neutral particles will generally remain unchanged as the magnetic field 34 is varied. The flux of neutral species may be altered, however, if the magnetic field changes the plasma chemistry or other characteristics of the plasma. The flux of neutral particles may be desirable or undesirable, depending on the application of the present invention. The effects of the neutral flux are application-specific and depend upon the gas chemistry. They are discussed below according to specific applications of the present invention.

While the present invention has many uses, two uses of particular interest are (1) providing in-situ control over etch anisotropy/isotropy and chemical selectivity, and (2) in-situ wafer protection during chamber seasoning.

In the present state of the art, isotropic etching often requires that the wafer 24 be removed from the plasma etching system and placed in a tool that is specifically designed to provide isotropic etching. For example, isotropic etching can be provided by wet chemical etching, or by a downstream chemical etching (CDE) tool in which the wafer is exposed to neutral species generated in a remotely located plasma. These isotropic etching techniques tend to reduce manufacturing throughput since they require increased wafer handling.

Plasma etching with charged particles is quite often anisotropic and chemically nonselective, since charged particles may remove material from the wafer according to physical processes (e.g. collisions, sputtering). This can be undesirable in some process steps where material selectivity or etch isotropy is desired.

In one important application of the present invention, the magnetic field 34 provides the ability to increase isotropy of a typically anisotropic etch process, and the ability to increase chemical selectivity. Specifically, the magnetic field shields the wafer 24 from charged particles, but allows neutral species to collide with the wafer 24. The flux of neutral species is relatively unaffected by the magnetic field 34 due to small perturbation of the plasma. Neutral species from the plasma generally etch according to chemical processes, and therefore, etching will become more isotropic and material selective when the magnetic field 34 is applied.

The strength of the magnetic field can be adjusted so that the balance between anisotropy/isotropy and the balance between material selectivity/nonselectivity can be tuned, or varied during the course of the etching process. Alternatively, the magnetic field can be switched so that the etching process is toggled between high anisotropy and high isotropy. Time-dependent variations in etching anisotropy and material selectivity can provide novel sidewall profiles, and can improve product throughput, since wafers will not need to be shuttled between multiple etching tools to provide multiple kinds of etching. Generally, the magnetic field should reflect at least about 50% of electrons in order to provide substantial isotropy.

It is noted that if the magnetic field is too strong, the plasma may be squeezed and pushed too far from the wafer, resulting in undesirable changes in the plasma chemistry, such as increased dissociation of neutral species. For this reason, the plasma etching tool should be designed to that the desired level of isotropy can be obtained without requiring a magnetic field so strong that it adversely affects the plasma.

In order for the magnetic field 34 to produce an increase in the isotropy of the plasma etch, the gas mixture used for the plasma should have certain characteristics. For example, the plasma chemistry must be selected so that neutral species in the plasma chemically attack the materials of the wafer that are to be removed. A common feature of such reactive gas mixtures is that they have considerable etching anisotropy when combined with high charged particle flux. Therefore, the present invention will provide a technique enabling isotropic etching where previously only anisotropic etching was achievable. This can allow for the removal of micromasking and similar defects.

Another advantage to the present isotropic etching technique is that it avoids undesirable effects of conventional isotropic etches. For example, isotropic etch chemistries etch laterally at the same rate as vertically. By altering between anisotropic and isotropic etch steps, a sidewall passivation layer can be deposited which reduces the lateral component during the isotropic portion.

In the present isotropic etching method, it is preferable that the flux of neutral species be unaffected by the magnetic field. For example, the neutral flux should be kept constant to within about 10% as the magnetic field is varied to adjust between anisotropic and isotropic etching. Keeping the neutral flux constant will tend to improve plasma etch process control and predictability. The neutral flux is nearly unaffected by the magnetic field since, by design, the magnetic field does not perturb the gas phase plasma significantly. Thus, the generation of reactive neutrals remains nearly constant, and their flux to the wafer remains nearly constant.

It is also noted that the magnetic field should be uniform when controlling the anisotropy and chemical selectivity of an etch process. Nonuniformities in etching characteristics can result in defective product. For example, the magnetic field strength can have a uniformity of within about 5-10%.

Plasma chemistries with increased isotropy in the absence of charged particles will typically have low polymer deposition from the gas phase. Examples of plasma chemistries that can be employed with the isotropy/anisotropy control aspect of the invention include $Cl_2+HBr$, $N_2+O_2+CO+CO_2$, $NF_3$, HCL, and $BCl_3$.

As noted above, chamber seasoning is required periodically to remove unwanted films of material deposited on chamber walls. These unwanted films can alter plasma etching processes, resulting in defective product. Seasoning is costly to manufacturing throughput because wafers typically must be removed from the chamber during seasoning to prevent damage. Similarly, seasoning can increase process cost due to damage of sensitive electrostatic chuck materials.

Plasma chemistries used for seasoning typically rely on charged particles to remove films from chamber walls. Also, higher power levels are typically used in chamber seasoning, compared to plasma etching. Therefore, charged particles will typically have a higher energy during chamber seasoning, and a higher magnetic field will be required to shield the wafer.

In the present invention, seasoning is performed with a strong magnetic field so that nearly all charged particles are shielded from the wafer. In the present seasoning method, the magnetic field does not need to be uniform since field uniformity is not required for charged particle shielding. During seasoning, the magnetic field should protect the wafer from as many charged particles as possible. Preferably, about 90 or 95% of electrons are reflected by the magnetic field during seasoning. If the magnetic field is too weak, damage to the wafer may result. Typically, the magnetic field can have a strength of about 20-1000 gauss to protect the wafer from charged particles during seasoning.

In the seasoning method according to the present invention, it is desirable for the charge flux to the chamber walls to be relatively unaffected by application of the magnetic field. For example, the charge flux to the chamber walls should change by less than about 10% when the magnetic field is applied.

With the present seasoning method, the wafer can remain in the plasma etch chamber during seasoning, thereby reducing the need for time-consuming wafer handling. As a result, manufacturing throughput can be increased, and wafer production costs can be reduced.

Plasma chemistries typically used for chamber seasoning that can be used in combination with the in-situ seasoning aspect of the invention include $O_2$, $CO$, $C_2F_6$, $CF_4$, $NF_3$, and $SF_6$. Neutrals will still provide some etching of the wafer during in-situ seasoning, but in the absence of charged particle bombardment, etching will be substantially reduced.

It will be clear to one skilled in the art that the above embodiment may be altered in many ways without departing from the scope of the invention. Accordingly, the scope of the invention should be determined by the following claims and their legal equivalents.

What is claimed is:

1. A method for chamber seasoning with a wafer in-situ, comprising the steps of:
   a) producing a chamber seasoning plasma above the wafer after etching said wafer;
   b) creating a magnetic field between the wafer and seasoning plasma, wherein the magnetic field is parallel to the wafer, and wherein the magnetic field decreases in strength with distance above the wafer, and wherein the magnetic field reflects electrons having an energy of 100 eV or less traveling toward the wafer in a Z-direction.

2. The method of claim 1 wherein about 90% or 95% of electrons from the chamber seasoning plasma traveling toward the wafer are reflected away from the wafer by the magnetic field.

3. A method for shielding a wafer from charged particles in a plasma, comprising the steps of:
   a) producing a plasma in a chamber above the wafer;
   b) creating a linear magnetic field between the wafer and the plasma, wherein the magnetic field is parallel to the wafer, and wherein the linear magnetic field decreases in strength with distance above the wafer such that the linear magnetic field reflects more than 50% of the electrons traveling from the plasma to the wafer away from the wafer.

4. The method of claim 3 wherein a chemistry of the plasma is selected such that the plasma provides chamber seasoning.

5. The method of claim 3 wherein the linear magnetic field reflects electrons having an energy of 10 eV or less traveling toward the wafer in a Z-direction.

6. The method of claim 3 wherein the linear magnetic field reflects electrons having an energy of 4 eV or less traveling toward the wafer in a Z-direction.

7. The method of claim 3 wherein chemistry of the plasma is selected such that shielding the wafer from charged particles causes an increase in isotropy of an etch process.

8. The method of claim 7 wherein the linear magnetic field reflects electrons having an energy of 2 eV or less traveling toward the wafer in a Z-direction.

* * * * *